(12) United States Patent
Heger et al.

(10) Patent No.: US 7,354,778 B2
(45) Date of Patent: Apr. 8, 2008

(54) METHOD FOR DETERMINING THE END POINT FOR A CLEANING ETCHING PROCESS

(75) Inventors: Percy Heger, Dresden (DE); Tobias Hoerning, Nossen (DE); Ralf Otto, Kesselsdorf (DE)

(73) Assignee: Infineon Technologies AG, Munich (DE)

( * ) Notice: Subject to any disclaimer, the term of this patent is extended or adjusted under 35 U.S.C. 154(b) by 339 days.

(21) Appl. No.: 10/656,353

(22) Filed: Sep. 5, 2003

(65) Prior Publication Data

US 2004/0087170 A1 May 6, 2004

(30) Foreign Application Priority Data

Sep. 5, 2002 (DE) ................. 102 41 590

(51) Int. Cl.
*H01L 21/00* (2006.01)
(52) U.S. Cl. .............. 438/9; 438/10; 438/714; 216/61
(58) Field of Classification Search .......... 438/5, 438/9, 10, 706, 710, 714; 216/59, 61
See application file for complete search history.

(56) References Cited

U.S. PATENT DOCUMENTS

| | | | |
|---|---|---|---|
| 4,602,981 A | | 7/1986 | Chen et al. ............. 156/627 |
| 5,169,407 A | * | 12/1992 | Mase et al. ............. 29/25.01 |
| 5,198,072 A | * | 3/1993 | Gabriel ................... 216/59 |
| 5,653,894 A | * | 8/1997 | Ibbotson et al. .......... 216/59 |
| 5,812,403 A | | 9/1998 | Fong et al. ........... 364/468.28 |
| 6,017,414 A | * | 1/2000 | Koemtzopoulos et al. ... 156/345.25 |
| 6,303,044 B1 | * | 10/2001 | Koemtzopoulos et al. .... 216/59 |
| 2003/0000546 A1 | * | 1/2003 | Richardson et al. ....... 134/1.1 |

FOREIGN PATENT DOCUMENTS

| | | |
|---|---|---|
| DE | 19605136 | 10/1997 |
| DE | 19605136 | 5/1999 |
| EP | 0458324 | 11/1991 |

* cited by examiner

*Primary Examiner*—Kin-Chan Chen
(74) *Attorney, Agent, or Firm*—Baker Botts L.L.P.

(57) ABSTRACT

A method is provided for determining the end point during cleaning etching of processing chambers by means of plasma etching, which is used for carrying out coating or etching processes during the manufacture of semiconductor components. The invention provides a method for effectively and reliably determining the end point during cleaning etching of processing chambers. The end point is determined by monitoring the DC bias voltage on the plasma generator which is used for the plasma cleaning etching in the processing chamber in an evaluation unit. The plasma cleaning etching process is terminated by stopping the supply of the process gases in the gas supply unit and by switching off the plasma generator upon reaching a predetermined DC bias voltage value which corresponds to completion of the cleaning etching process.

6 Claims, 2 Drawing Sheets

METHOD FOR DETERMINING THE END POINT FOR A CLEANING ETCHING PROCESS

BACKGROUND OF THE INVENTION

As the structure sizes of modern semiconductor components continue to decrease, greater care must be taken to ensure proper environmental conditions during manufacturing processes. In particular, extremely stringent cleanliness requirements must be ensured. This of particular importance in processing chambers, in which plasma-aided coating or etching processes are performed under vacuum conditions. The presence of even minor impurities can produce significant defects in the layers on a substrate which are produced by plasma chemical vapor deposition ("CVD"), or else may result in faults caused during plasma etching processes. The presence of impurities in a processing chamber may also have additional negative effects on the quality of plasma CVD processes.

Impurities may be residues from previous processing steps in the processing chamber, such as deposits on the inner walls of the processing chamber resulting from coating processes such as plasma CVD processes. These deposits may result in contaminant particles in the processing chamber which may interfere with subsequent process steps. One such processing chamber for carrying out plasma etching processes on individual substrates, i.e., wafers, is disclosed in U.S. Pat. No. 4,602,981 A with relatively large processing chambers being used in order to increase throughput by processing a greater number of wafers at the same time. However, the problem described above can apply to all types of plasma apparatus and CVD apparatus.

DE 196 05 136 A1 describes a method and apparatus for controlling the coating of surfaces in the vacuum chamber. This is done by temporarily separating a process area within the processing chamber and performing a plasma process in that area. This limits the influence of the plasma to the temporarily separated process area so that process gases, the reaction products, and the plasma are isolated to act only on small surfaces.

Using methods such as those described above, contaminating layers may be restricted to grow on a small number of surface areas. The corresponding parts may then be cleaned or replaced during the course of the normal maintenance cycles. One disadvantage of this solution is the rather high level of technical complexity and the large number of components which are additionally required in the processing chamber some of which are also moving components. Furthermore, these additional components may themselves be sources of impurities.

For these reasons, the processing chambers used in presently known manufacturing processes must be cleaned or tuned by means of a cleaning process based on plasma cleaning etching after each plasma processing procedure or after a predetermined number of plasma processing procedures. However, care must be taken during this cleaning process to ensure that no overetching occurs. Overetching would result in degradation of the inner metal surfaces of the processing chamber, which is composed of metal (e.g., Al). Such degradation could lead to considerable reduction in the useful life of the processing equipment. Therefore, while adequate cleaning of the processing chamber is important, overetching must be avoided.

U.S. Pat. No. 5,812,403 describes an apparatus for depositing a dielectric film on a substrate by means of a plasma CVD process performed in a processing chamber. This reference also describes a method for periodic cleaning of the processing chamber using a remote plasma and specific cleaning gases. The remote plasma system produces fluorine radicals which are passed to the processing chamber where they may be used to clean the chamber at high temperatures. This cleaning process is based on chemical reactions—physical sputtering effects are negligible since the remote plasma remains outside the processing chamber.

In contrast, an in-situ plasma system can lead to sputtering effects which can damage the aluminum chamber walls.

U.S. Pat. No. 5,812,403 describes a method for determining the end point (clean endpoint) of a cleaning process which is performed within a processing chamber. In this method, the change in the light absorption of the cleaning gas reactants, for example of $SiF_4$, $CF_4$, $C_2F_6$, $C_3F_8$, $SF_6$ is observed visually. Reactants are supplied such that they pass an IR light source so that the attenuation of the IR radiation through the reactants can be measured via an IR receiver. If a light intensity reference value is exceeded, the gas supply is stopped and the cleaning process is thus terminated.

One disadvantage in this case is that the hardware complexity is still considerable. Furthermore, there may be significant measurement uncertainty since the optical characteristics of the quartz window which is required for observation may also change during a plasma-chemical coating process. Additionally, it is very difficult to determine the end point by optical means as a result of the minor measurement differences involved, and the corresponding difficulty in converting the optical data to data that can be evaluated electrically. As a result of these difficulties, overetching is generally carried out deliberately in order to ensure that the processing chamber has been sufficiently well cleaned.

Finally, the already cited U.S. Pat. No. 4,602,981 describes a method for controlling plasma etching of wafers in a wafer reactor. In this method, the RF voltage which is influenced directly by the plasma potential is monitored on one electrode of the reactor. This assumes an electrically balanced reactor, so that the change in the plasma density resulting from the emission of secondary electrons within the reactor can be monitored by means of the RF voltage. However, this type of monitoring cannot be used for determination of the endpoint for cleaning etching, since the method control is different.

It is an object of the present invention to provide a method for reliable determination of the endpoint during cleaning etching of processing chambers.

SUMMARY OF THE INVENTION

The objective of the invention is to provide a method of the type mentioned initially in that the DC bias voltage on the plasma generator, which is used for plasma cleaning etching in the processing chamber, is monitored during the cleaning etching process, and in that the plasma cleaning etching process is ended by terminating the supply of the process gases and by switching off the plasma generator when a predetermined value is reached.

In one exemplary embodiment of the present invention, a method for determining an end point of a plasma etching process us provided. In a first step, a DC bias voltage of a plasma generator during a cleaning etching process is monitored. Next, the DC bias voltage is compared to a predetermined value corresponding to a clean processing chamber. Last, the plasma cleaning etching process is terminated by disconnecting a supply of process gases and deactivating the plasma generator when the DC bias voltage reaches the predetermined value.

This method for determining the clean endpoint has the particular advantage that the algorithm which is required to determine the endpoint is easily implemented, since only one maximum of the DC bias voltage must be determined. The method also provides for an accurate means to terminate the cleaning process at the appropriate time.

For a more complete understanding of the present invention, the needs satisfied thereby, and the objects, features, and advantages thereof, reference now is made to the following descriptions taken in connection with the accompanying drawings:

DETAILED DESCRIPTION OF THE INVENTION

Figure 1:
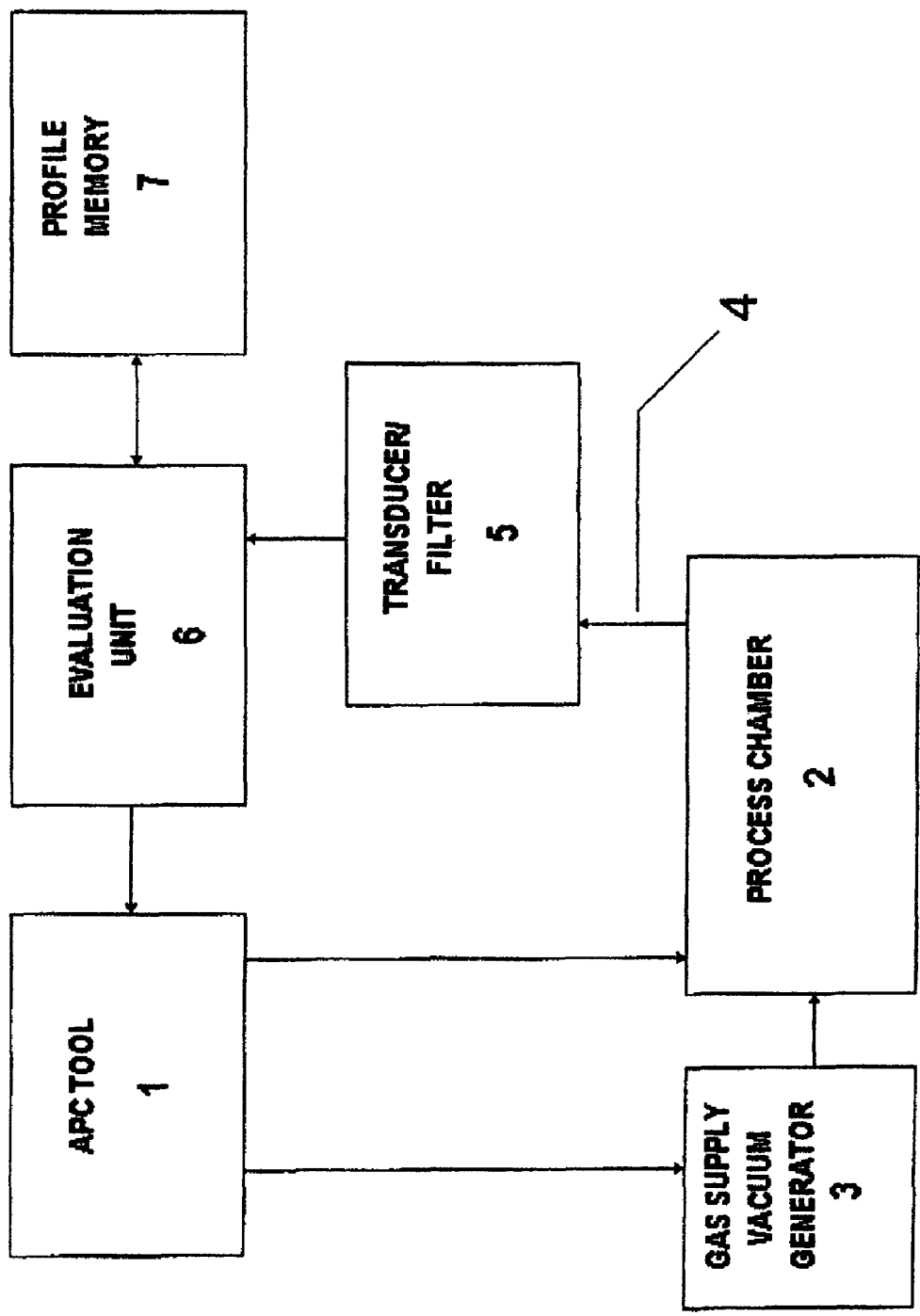
FIG. 1 shows a schematic block diagram of an arrangement for carrying out the method for determining the endpoint during cleaning etching.

The schematic block diagram shown in FIG. 1 illustrates the major functional units which are used to perform the method according to one exemplary embodiment of the present invention. The functional units described in the following text may also be combined in an APC Tool 1 (advanced process control tool).

A processing chamber 2 is provided, in order to perform a plasma process. For this purpose, the processing chamber 2 is coupled to a plasma generator which can produce an in-situ plasma in the processing chamber 2 under the necessary vacuum conditions. The processing chamber 2 is connected to a gas supply unit/vacuum generator 3, so that the conditions which are required for the particular type of processing (e.g., plasma-enhanced chemical vapor deposition) can be created in the processing chamber 2. The process may be controlled by the APC tool 1.

APC tool 1 may ensures that the process parameters, such as the RF voltage, quantity and nature of the process gases to be supplied, etc., are set and monitored. The APC tool 1 may be configured, for example, to start or to end the cleaning process by plasma etching, or to control a step of processing a semiconductor wafer in the processing chamber. In accordance with the present invention, the DC bias voltage 4 is monitored. The measurement of the DC bias voltage 4 which is required for this purpose may be performed between ground and a decoupling electrode of the plasma generator, which decoupling electrode is located within the processing chamber 2. The DC bias voltage may also be measured in other ways within the scope of the present invention.

The DC bias voltage 4 may be measured using a suitable measurement device in conjunction with a conventional measurement transducer/filter 5, which then passes the DC bias voltage 4, as measured, to an evaluation unit 6. The measurement of the DC bias voltage 4 may be performed continuously or at discrete intervals.

Figure 2:
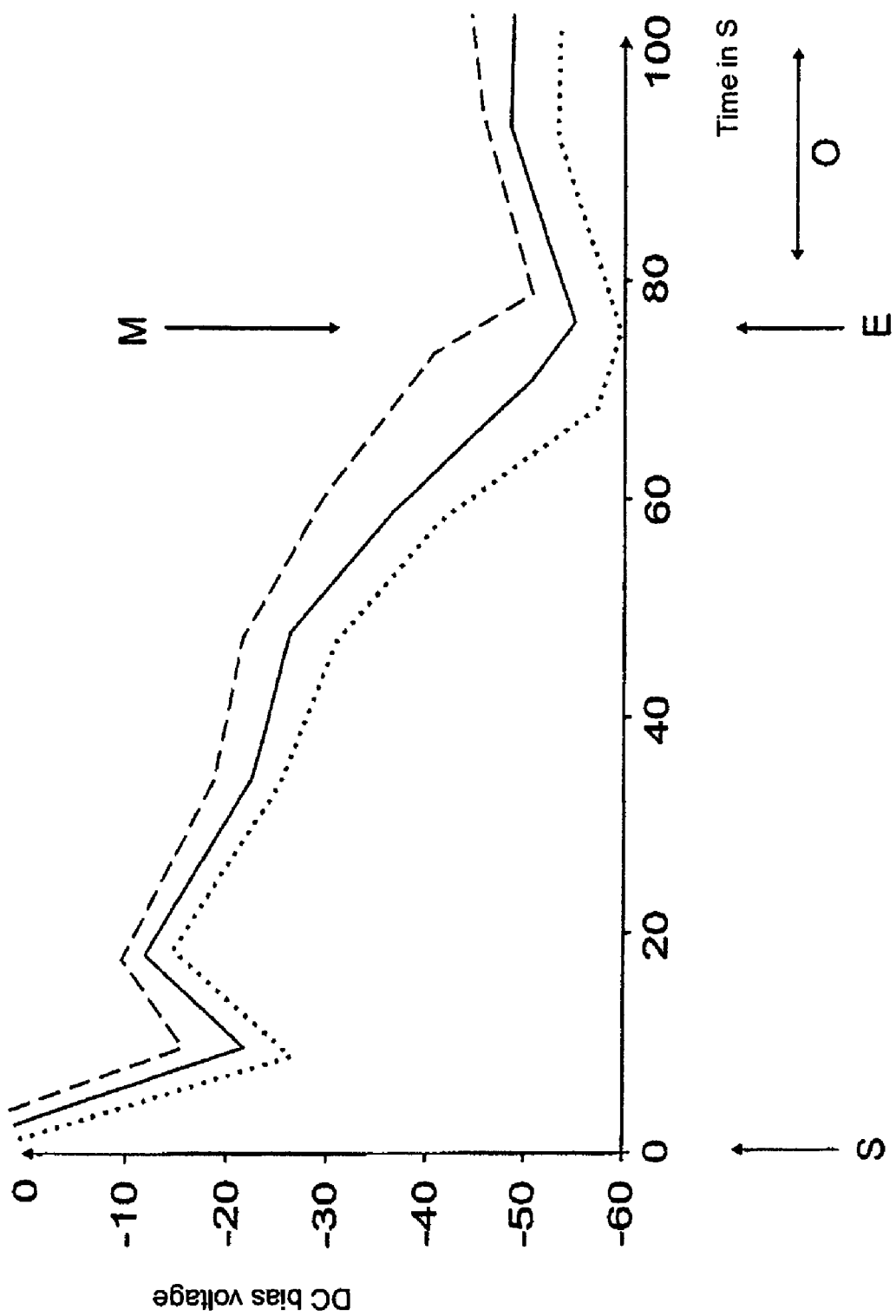
FIG. 2 shows an illustration of characteristic DC bias voltage profiles for different etching parameters.

Referring now to FIG. 2, the evaluation unit 6 monitors the voltage profile of the DC bias voltage 4 starting at the clean start S to the clean endpoint E and provides appropriate information to the APC tool 1 when the DC bias voltage 4 has reached some predetermined value. In this exemplary embodiment of the present invention, in order to facilitate comparison between the profiles of the DC bias voltages, the profiles may be stored in a memory unit 7.

Practically measured voltage profiles for the DC bias voltage 4 are shown in FIG. 2 for different process parameters. The illustrated curves for the voltage profiles of the DC bias voltage 4 indicate a good match at the time of the predetermined clean endpoint E. As can be seen, the DC bias voltage 4 is not significantly influenced by the various process parameters. This means that the monitoring of the predetermined maximum M of the DC bias voltage 4 during plasma cleaning etching allows the clean endpoint to be determined extremely reliably.

In this case, the predetermined maximum M of the DC bias voltage 4 may be stored for each plasma cleaning etching process, or a predetermined number of previous measurement processes may be stored. Notably, the endpoint need not be a maximum voltage, but may be any predetermined voltage which can be used to determine a corresponding end point for adequate cleaning of the processing chamber. It is also possible, in another exmeplary embodiment of the present invention, to measure the entire profile of the DC bias voltage 4 and to compare this with a stored DC voltage profile, thus achieving particularly reliable identification of the clean endpoint E. If the comparison of the DC bias voltage profiles is in any case carried out for identical process gases and process parameters, then this results in the clean endpoint E being identified even more accurately. However, the profiles need not be dependent on the particular process gases and process parameters.

In another exemplary embodiment of the present invention, even after expiration of the end point E of the cleaning etching process, overetching may still be deliberately performed for a limited time. However, this would preferably be restricted to a few seconds in order to make certain that the cleaning process has been performed to completion while still precluding significant damage to the inner wall of the processing chamber 2. This may be represented in FIG. 2 where the overetched time 0 has elapsed.

While there have been described various embodiments of the invention, those skilled in the art will recognize that other changes and modifications may be made thereto without departing from the spirit of the invention, and it is intended to claim all such changes and modifications as fall within the true scope of the invention.

We claim:

1. A method for determining an end point of a plasma etching process using ionized process gases for cleaning etching of a processing chamber that is used for coating or etching processes during the manufacture of semiconductor components, comprising the steps of:
   monitoring a DC bias voltage profile of a plasma generator during a cleaning etching process run, wherein the DC bias voltage is the voltage measured between ground and a decoupling electrode of the plasma generator disposed within the processing chamber, and wherein the voltage measurement points are selected so that the measured voltage profile has a maximum in the voltage profile at the endpoint of the cleaning etching process indicating that the processing chamber is clean;

comparing the DC bias voltage to a stored value representing a clean processing chamber, wherein the stored value is predetermined from a prior plasma cleaning etching process run; and terminating the plasma cleaning etching process by disconnecting a supply of process gases and deactivating the plasma generator when said DC bias voltage reaches said predetermined value.

2. The method according to claim 1, wherein the measured DC voltage profile is compared with a previously stored DC voltage profile.

3. The method according to claim 2, wherein the comparison of the DC voltage profiles is performed for process runs with the same process gases and process parameters.

4. The method according to claim 1, wherein a plurality of DC voltage profiles of plasma cleaning etching process are stored.

5. The method according to claim 4, wherein the measured-DC voltage profile is compared with a previously stored DC voltage profile.

6. The method according to claim 5, wherein the comparison of the DC voltage profiles is performed for process runs with the same process gases and process parameters.

* * * * *